United States Patent
Hayashi et al.

(10) Patent No.: US 7,838,335 B2
(45) Date of Patent: *Nov. 23, 2010

(54) MANUFACTURING METHOD OF SEMICONDUCTOR DEVICE WITH A MOLD RESIN HAVING A MOLD RELEASE AGENT

(75) Inventors: Eiji Hayashi, Tokyo (JP); Takahiro Sugimura, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 59 days.

This patent is subject to a terminal disclaimer.

(21) Appl. No.: 12/268,050

(22) Filed: Nov. 10, 2008

(65) Prior Publication Data

US 2009/0075425 A1    Mar. 19, 2009

Related U.S. Application Data

(63) Continuation of application No. 11/618,142, filed on Dec. 29, 2006, now Pat. No. 7,459,342.

(30) Foreign Application Priority Data

Feb. 22, 2006    (JP) .............................. 2006-045647

(51) Int. Cl.
   *H01L 21/48*    (2006.01)
   *H01L 21/50*    (2006.01)

(52) U.S. Cl. ...................................... 438/108; 438/127
(58) Field of Classification Search ....................... None
See application file for complete search history.

(56) References Cited

U.S. PATENT DOCUMENTS 7,459,342 B2 * 12/2008 Hayashi et al. ............. 438/108

FOREIGN PATENT DOCUMENTS

| JP | 11-35800 | 2/1999 |
| JP | 2000-281750 | 10/2000 |
| JP | 2001-85609 | 3/2001 |
| JP | 2001-270977 | 10/2001 |

* cited by examiner

*Primary Examiner*—Scott B Geyer
(74) *Attorney, Agent, or Firm*—Mattingly & Malur, P.C.

(57) ABSTRACT

The adhesive property of the mold resin exposed to the ball face side of a semiconductor package and under-filling resin is improved, and the manufacturing method of the semiconductor device which can prevent peeling at both interface is obtained. The sputtering step which does sputtering of the ball face side of the semiconductor package whose mold resin in which wax or fatty acid was included exposed to the ball face side by Ar plasma, the step which does flip chip junction of the semiconductor package at wiring substrate upper part after the sputtering step, and the step fills up with under-filling resin between the semiconductor package and the wiring substrate are included.

5 Claims, 10 Drawing Sheets

MANUFACTURING METHOD OF SEMICONDUCTOR DEVICE WITH A MOLD RESIN HAVING A MOLD RELEASE AGENT

This is a continuation application of U.S. Ser. No. 11/618,142, filed Dec. 29, 2006 now U.S. Pat. No. 7,459,342, the disclosure of which is hereby incorporated by reference.

CROSS-REFERENCE TO RELATED APPLICATION

The present application claims priority from Japanese patent application No. 2006-45647 filed on Feb. 22, 2006, the content of which is hereby incorporated by reference into this application.

FIELD OF THE INVENTION

The present invention relates to a manufacturing method of the semiconductor device which does flip chip junction of the semiconductor package whose mold resin exposed to the ball face side at a wiring substrate, and is filled up with under-filling resin between both.

DESCRIPTION OF THE BACKGROUND ART

Transfer mold formation is performed in the manufacturing process of a semiconductor package (CSP: Chip Scale Package). And in order to improve the mold-release characteristic when picking out mold goods from a forming mold after formation, the mold resin with which the release agent was included is used (for example, refer to Patent Reference 1 and 2). By adding a little flexibilizer, such as silicone oil, internal stress may be reduced and damage to a chip etc. may be prevented (for example, Patent Reference 4). The semiconductor package whose mold resin exposed to the ball face side is proposed (for example, refer to Patent Reference 3).

[Patent Reference 1] Japanese Unexamined Patent Publication No. Hei 11-35800

[Patent Reference 2] Japanese Unexamined Patent Publication No. 2000-281750

[Patent Reference 3] Japanese Unexamined Patent Publication No. 2001-85609

[Patent Reference 4] Japanese Unexamined Patent Publication No. 2001-270977

SUMMARY OF THE INVENTION

However, the problem that peeling occurred in the interface of mold resin and under-filling resin was newly found out as doing flip chip junction of the semiconductor package whose mold resin exposed to the ball face side at a wiring substrate, and being filled up with under-filling resin between both. The reasons are thought to be that a release agent comes out on the surface of mold resin, and the adhesion of this with under-filling resin is getting worse, and it may become difficult to secure the adhesive strength of silicone oil and under-filling resin when silicone oil is added as a low stress agent. Even if $O_2$ plasma treatment was performed before under-filling, the above-mentioned peeling was not able to be prevented.

The present invention was made in order to solve the above problems, and the purpose is to obtain the manufacturing method of the semiconductor device which can improve the adhesive property of the mold resin exposed to the ball face side of a semiconductor package, and under-filling resin, and can prevent peeling at both interface.

The manufacturing method of a semiconductor device concerning the present invention comprises the steps of doing sputtering of the ball face side of the semiconductor package whose mold resin in which additives, such as wax, fatty acid, or silicone oil, were included exposed to the ball face side by Ar plasma, doing flip chip junction of the semiconductor package at wiring substrate upper part after the sputtering step, and filling up with under-filling resin between the semiconductor package and the wiring substrate. The other features of the present invention are made clear to below.

By the present invention, the adhesive property of the mold resin exposed to the ball face side of a semiconductor package and under-filling resin can be improved, and peeling at both interface can be prevented.

DETAILED DESCRIPTION OF THE PREFERRED EMBODIMENTS

Embodiment 1

Figure 1:
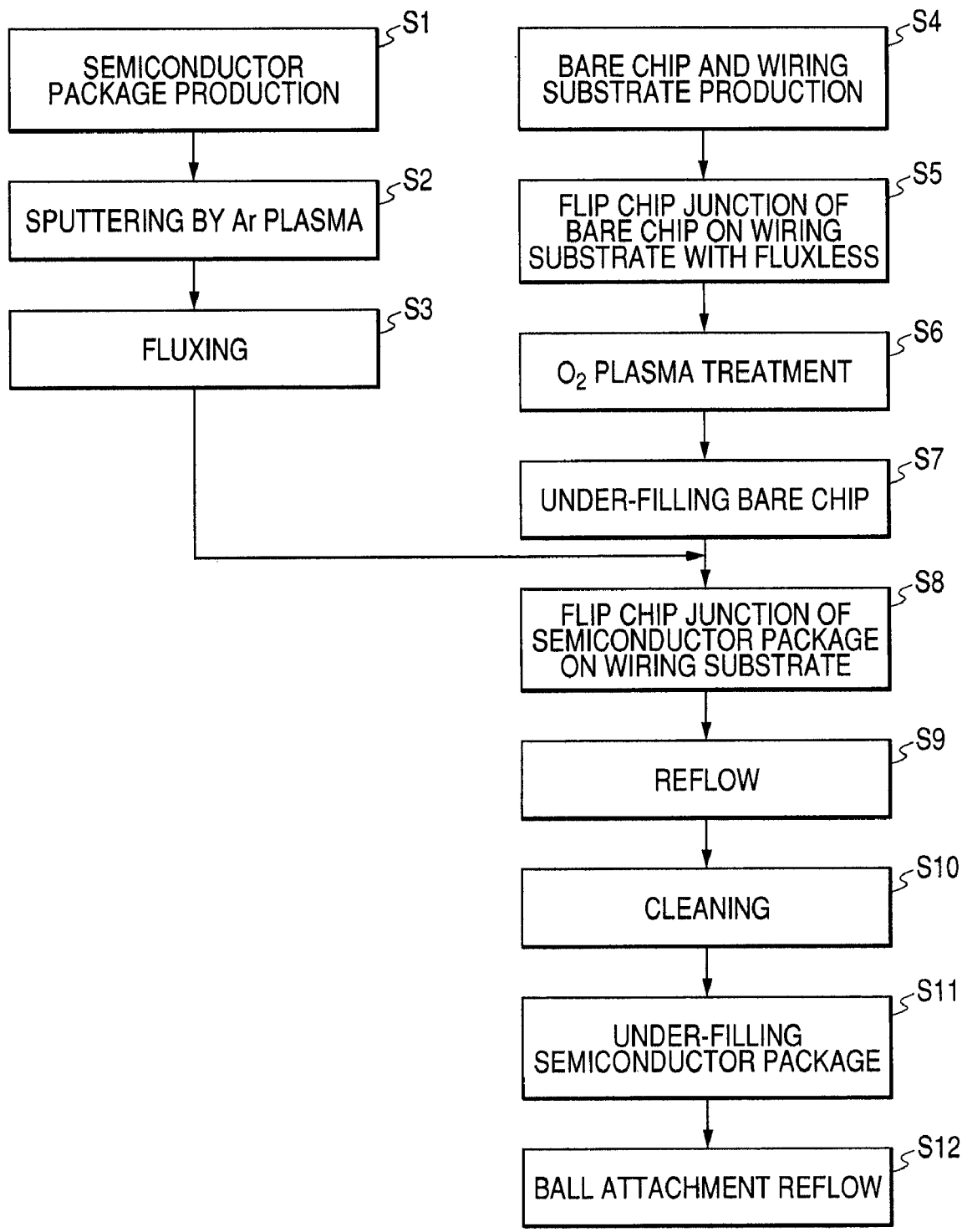
FIG. 1 is a flow chart which shows the manufacturing method of the semiconductor device concerning Embodiment 1 of the present invention.

Hereafter, the manufacturing method of the semiconductor device concerning Embodiment 1 of the present invention is explained referring to the flow chart of FIG. 1.

Figure 2:
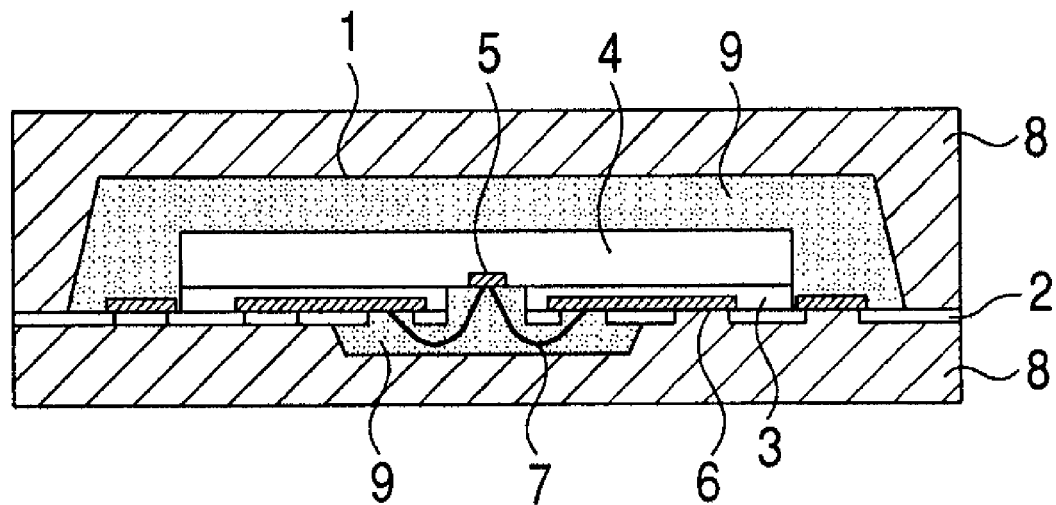
FIG. 2 is a cross-sectional view showing the manufacturing process of a semiconductor package.
Figure 3:
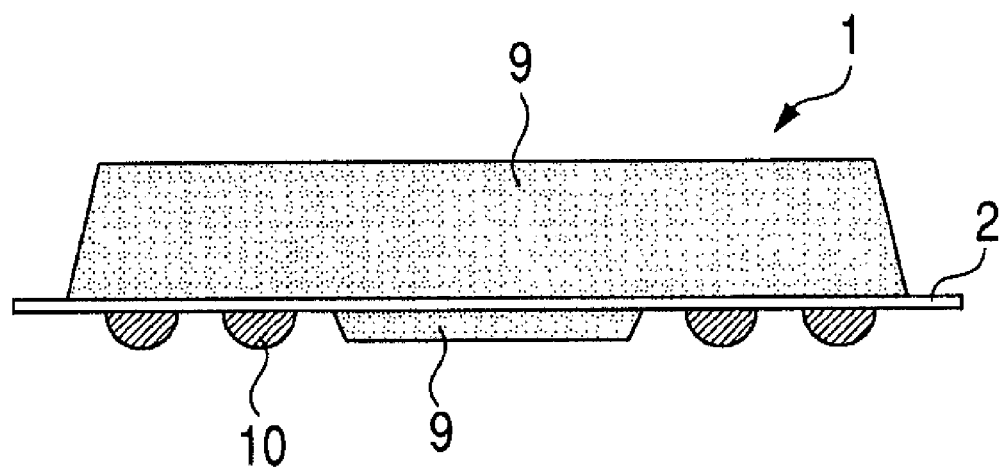
FIG. 3 is a side view showing the manufacturing process of a semiconductor package.

First, semiconductor package 1 is produced (Step S1). Concretely, as shown in FIG. 2, chip 4 is mounted via elastomer sheet 3 on substrate 2. And center pad 5 of chip 4 and electrode 6 of substrate 2 are connected with wire 7, passing the opening of substrate 2 center. Metallic mold 8 is equipped with substrate 2, and batch sealing of chip 4, wire 7, and the elastomer sheet 3 is done with mold resin 9. Next, as shown in FIG. 3, solder ball 10 is attached to the under surface of substrate 2. Hereby, semiconductor package 1 whose mold resin 9 exposed to the ball face side is produced.

Thus, when forming mold resin 9 with metallic mold 8, mold resin 9 in which the release agent was included is used. For example, natural wax, such as paraffin wax, rice wax, carnauba wax and candelilla wax, oil system wax, such as polyethylene wax and oxidized polyethylene wax, and wax or fatty acid, such as high-class aliphatic series ketone, high-class aliphatic series ester, higher fatty acid, and high-class fatty alcohol are mentioned as release agent. In order to reduce a warp of semiconductor package 1, a lot of fillers are added in mold resin 9. That is, semiconductor substrates, such as a single crystal silicon substrate used as the main structures of semiconductor chip 4, have a small coefficient of thermal expansion. Therefore, the coefficient of thermal expansion as the semiconductor chip 4 whole also becomes very small like about 3 ppm/° C. Generally not only a single crystal silicon substrate but an SOI (Silicon On Insulator) substrate has a small coefficient of thermal expansion too compared with epoxy system resin etc. So, as for mold resin 9, the filler which includes silica with a coefficient of thermal expansion small to epoxy system resin etc. is added in large quantities, and the material which made thermal expansion coefficient difference with semiconductor chip 4 as small as possible is used. In this embodiment, the material which added silica of more than 80 wt % at least, more desirably about 90 wt % to epoxy system resin is used as mold resin 9. In such a case, the filler which includes silica etc. has a high elastic modulus as compared with the epoxy system resin which forms mold resin 9, for example, and the internal stress generated to semiconductor chip 4 sealed by mold resin 9 inside becomes quite high. So, a little flexibilizer may be added to mold resin 9 as a low stress agent. As flexibilizer, various silicone oil, silicone rubber, acrylic nitrile butadiene rubber, etc. may be used. In particular, various silicone oil, such as epoxy modified silicone oil, is effective from aspects, such as chemical stability. However, when using mold resin 9 to which silicone oil was added, guarantee of adhesive strength with under-filling resin 20 becomes difficult. Silicone oil which may be used as a release agent has the character that it is difficult to secure adhesive power and adhesive strength with other organic substances etc. In mold resin 9 which contains silica filler of more than 80 wt % at least, in order to attain stress reduction and to prevent the crack of semiconductor chip 4, it is preferred to add the silicone oil beyond 0.3 wt %. However, it becomes difficult to secure adhesive strength with other organic resin when the content of silicone oil exceeds 0.1 wt %.

Figure 4:
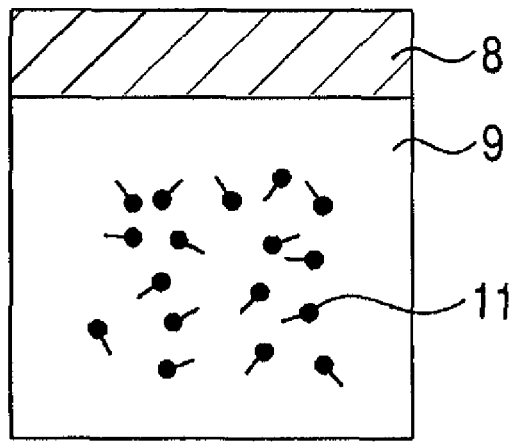
FIGS. 4 to 6 are enlarged sectional views showing near the interface of mold resin and a metallic mold.
Figure 5:
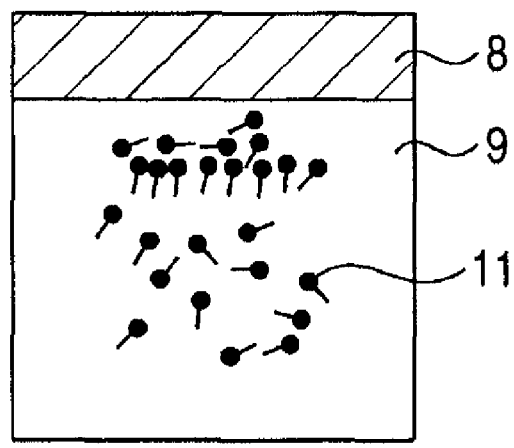
Figure 6:
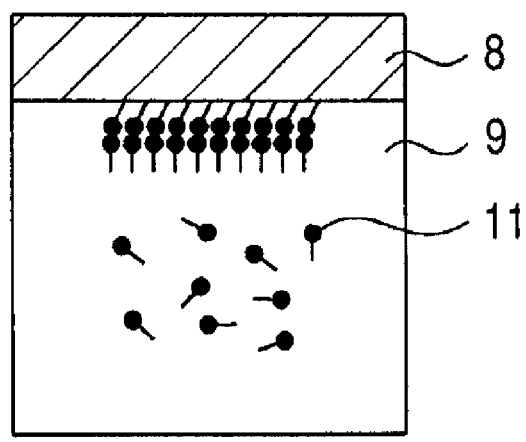

As shown in FIG. 4 immediately after formation, release agent 11 is distributed in mold resin 9. However, when time passes, as shown in FIG. 5, release agents 11 will begin to gather in mold resin 9. And eventually, as shown in FIG. 6, the layer of release agent 11 is formed near an interface with metallic mold 8. The layer of this release agent 11 becomes the cause of degrading the adhesive property of mold resin and under-filling resin (after-mentioned).

Figure 7:
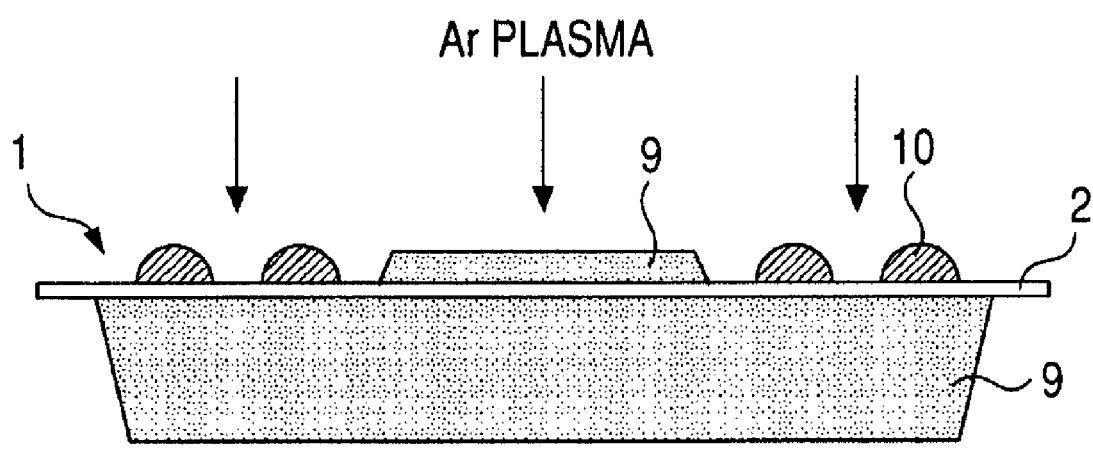
FIGS. 7 to 16 are side views showing the manufacturing process of the semiconductor device concerning Embodiment 1 of the present invention.

Then, as shown in FIG. 7, sputtering of the ball face of semiconductor package 1 is done by Ar plasma (Step S2). That is, Ar plasma is accelerated in an electric field and it hits against the ball face of semiconductor package 1. Hereby, the layer of release agent 11 formed in the front surface of mold resin 9 is physically removable with plasma. The front surface of mold resin 9 can be made rough, and a contact area with under-filling resin (after-mentioned) can also be increased. Also when securing the adhesive strength of mold resin 9 containing silicone oil and under-filling resin 20, the surface treatment according to Ar plasma is effective. As a means to reform a resin front surface and to improve adhesive property with a binder, there was a means of Ar plasma and oxygen plasma cleaning. To mold resin 9 in this embodiment, there is the feature that the effect of an improvement of adhesive strength is not fully acquired in oxygen plasma cleaning, but the improving effect of adhesive strength is fully acquired when it is Ar plasma. When oxygen plasma cleaning is performed for example, to wiring substrate 14 front surface, an organic combination will be cut by oxygen radical plasma, a functional group having included oxygen will be formed in the front surface, and the activity surface state which was extremely rich in adhesive property will be acquired. However, the silicone oil contained in mold resin 9, for example, the silicone oil which did epoxy modification in part, is dramatically excellent in the stability over thermal oxidation. Therefore, there is a problem that progress of cutting of a methyl group is slow and formation of the functional group which is rich in adhesive property does not fully progress even if it exposes to oxygen radical plasma for a long time. In processing by Ar plasma, by accelerating by a big electric field, Ar ion in Ar plasma is made to collide with mold resin 9 used as a target. When Ar ion with high energy collides, the methyl group of silicone oil is cut effectively. And, since a firm combination is formed between the side chain of polysiloxane, and under-filling resin 20 in a subsequent under-filling resin injection step (after-mentioned), improvement in adhesive strength with under-filling resin 20 is obtained.

However, in a sputtering step, it is preferred to make the amount of shaving of mold resin 9 less than or equal to the average of the diameter of the filler included in mold resin 9. It can prevent a filler dropping out of mold resin in large quantities by this, and the defect of ball connection can be prevented.

Figure 8:
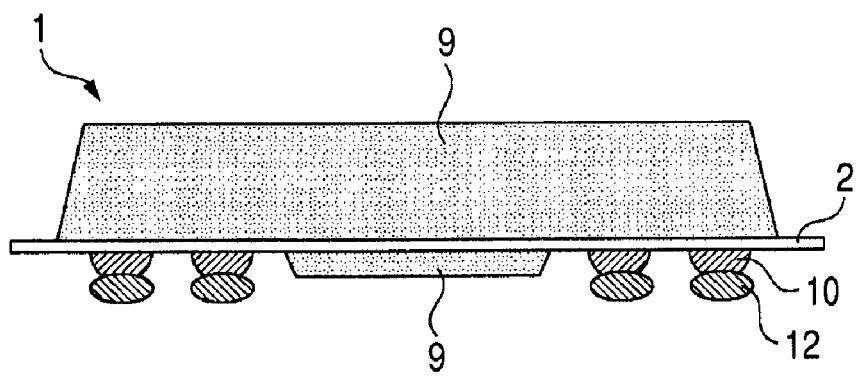

Next, flux 12 is applied to the ball face of semiconductor package 1 as shown in FIG. 8 (Step S3).

Figure 9:
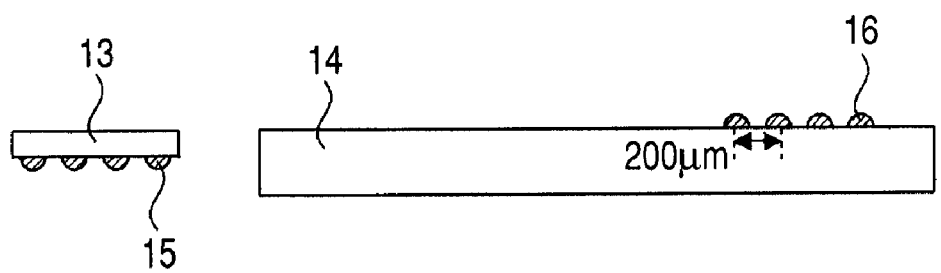

Next, as shown in FIG. 9, bare chip 13 and wiring substrate 14 are produced (Step S4). Solder ball 15 is attached to bare chip 13, and solder ball 16 is attached to wiring substrate 14. A plurality of these solder balls 15 and 16 are put in order at intervals of 200 μm, respectively.

Figure 10:
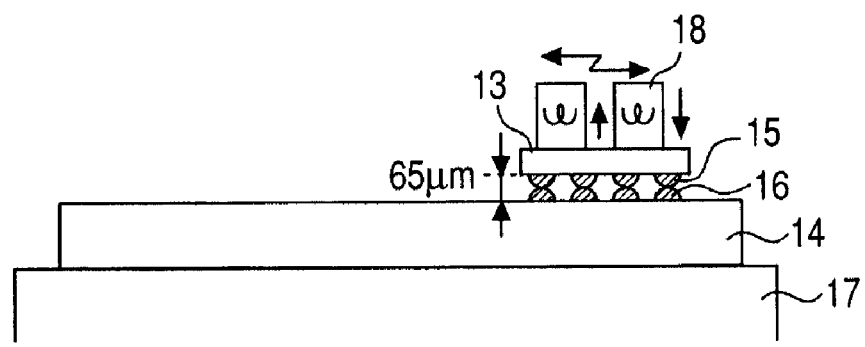

Next, as shown in FIG. 10, wiring substrate 14 is mounted on stage 17, bare chip 13 is held with tool 18, and tool 18 and stage 17 are heated to 180° C. And tool 18 is heated to 300° C. which is high temperature from the melting point (210° C. in the case of Sn1% Ag0.5% Cu) of solder, contacting solder ball 15 and solder ball 16, and maintaining stage 17 at 180° C. Flip chip junction of the bare chip 13 is done by a fluxless on wiring substrate 14, applying supersonic vibration to bare chip 13 (Step S5). Here, the amplitude of supersonic vibration is made into about ±35 μm which is about ⅓ of diameter 100 μm of solder balls 15 and 16, and applying time is made into about 1 second. Then, maintaining stage 17 at 180° C., tool 18 is cooled to 200° C. and tool 18 is raised.

Thus, by applying supersonic vibration, the natural-oxidation film of solder ball 15 and 16 front surface can be destroyed in fluxless, and good junction can be realized. Since the gap of bare chip 13 and wiring substrate 14 is as narrow as about 65 μm, the flux between both cannot be flushed but a flux residue occurs when flux is used. On the other hand, there are no worries about the generation of a flux residue by joining by a fluxless. Therefore, the generation of the void by flux expanding in under-filling resin can be prevented.

Figure 11:
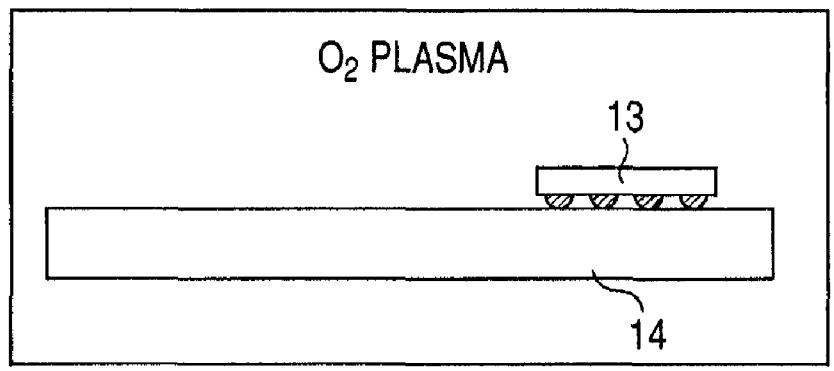

Next, as shown in FIG. 11, $O_2$ plasma treatment is performed to bare chip 13 (Step S6). In $O_2$ plasma treatment, the wiring substrate to which bare chip 13 was connected is exposed into oxygen radical plasma with a direct plasma system. As above-mentioned, since an organic combination of the solder-resist film of wiring substrate 14 front surface and the polyimide passivation film of bare chip 13 front surface is cut by it, and a functional group having included oxygen is formed in a front surface of it, the activity surface state which was extremely rich in adhesive property is acquired. Since cleaning of a narrow place can also be especially performed in a direct plasma system as compared with the system which accelerates and makes Ar ion collide in an electric field, the cleaning after doing flip chip junction of the bare chip 13 at wiring substrate 14 is also possible.

Here, since only two element systems can be formed in plating, solder ball 15 of bare chip 13 includes Sn2.5% Ag, and solder ball 16 of wiring substrate 14 includes SnCu. And when both solder balls 15 and 16 join by flip chip junction, reliable Sn1% Ag0.5% Cu will be formed. However, when sputtering of the ball face of bare chip 13 is done with Ar plasma, only solder ball 15 of bare chip 13 can be shaved, the composition ratio of the solder formed of junction changes, and there is a problem that reliability is spoiled. When sputtering is done with Ar plasma, there is also a problem that the trap of the electric charge will be done by the charge up to the gate insulating film in bare chip 13, and an element characteristic will change. Therefore, in bare chip 13, it is better not to do sputtering by Ar plasma.

Figure 12:
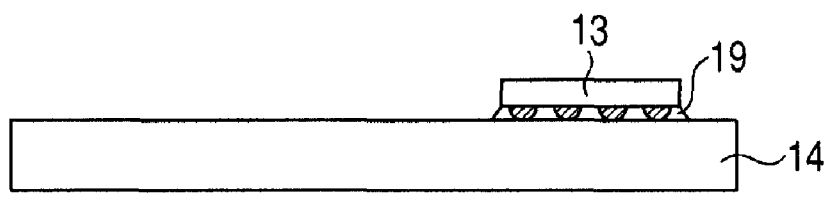

Next, as shown in FIG. 12, under-filling resin 19 fills up between bare chip 13 and wiring substrate 14 (Step S7). Thus, it can prevent flux 12 of semiconductor package 1 entering between bare chip 13 and wiring substrate 14 in a later step by performing under-filling about bare chip 13, before mounting semiconductor package 1.

Figure 13:
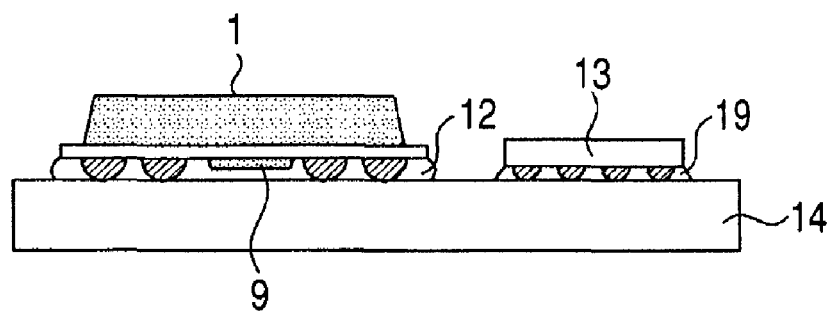
Figure 14:
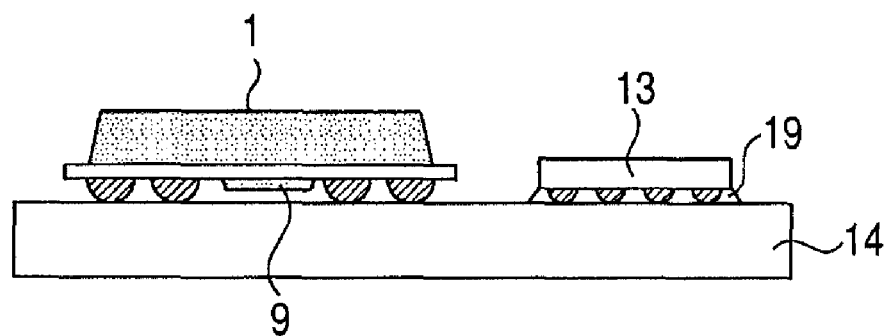

Next, as shown in FIG. 13, flip chip junction of the semiconductor package 1 is done on wiring substrate 14 (Step S8). And reflow (melting) is performed in a nitrogen atmosphere (Step S9). Then, as shown in FIG. 14, washing is done and flux 12 is removed (Step S10). On this occasion, it is preferred to use the cleaning agent of an organic solvent system, such as alcohol, in the case of rosin system flux, and to use pure water etc. in the case of water-soluble flux.

Figure 15:
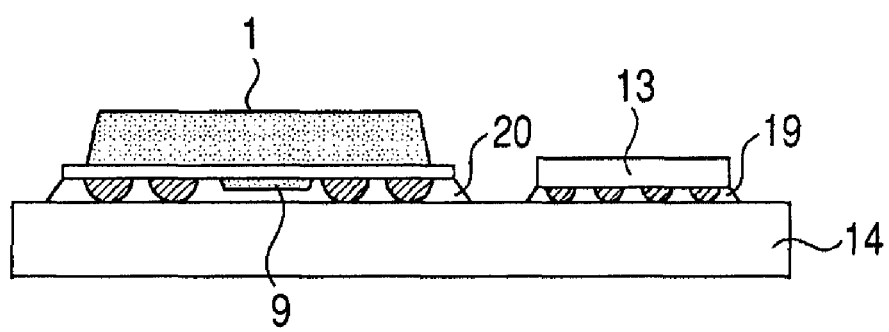
Figure 16:
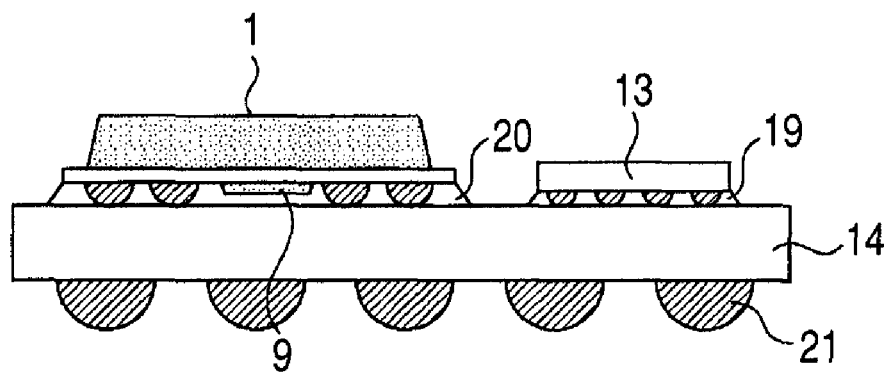

Next, as shown in FIG. 15, under-filling resin 20 is filled up between semiconductor package 1 and wiring substrate 14 (Step S11). Then, as shown in FIG. 16, solder ball 21 is attached to the under surface of wiring substrate 14 for external connection, and reflow is performed (Step S12). Although heat stress occurs by this reflow, since the adhesive property of mold resin 9 and under-filling resin 20 is improved as mentioned above, peeling at both interface can be prevented.

Embodiment 2

Figure 17:
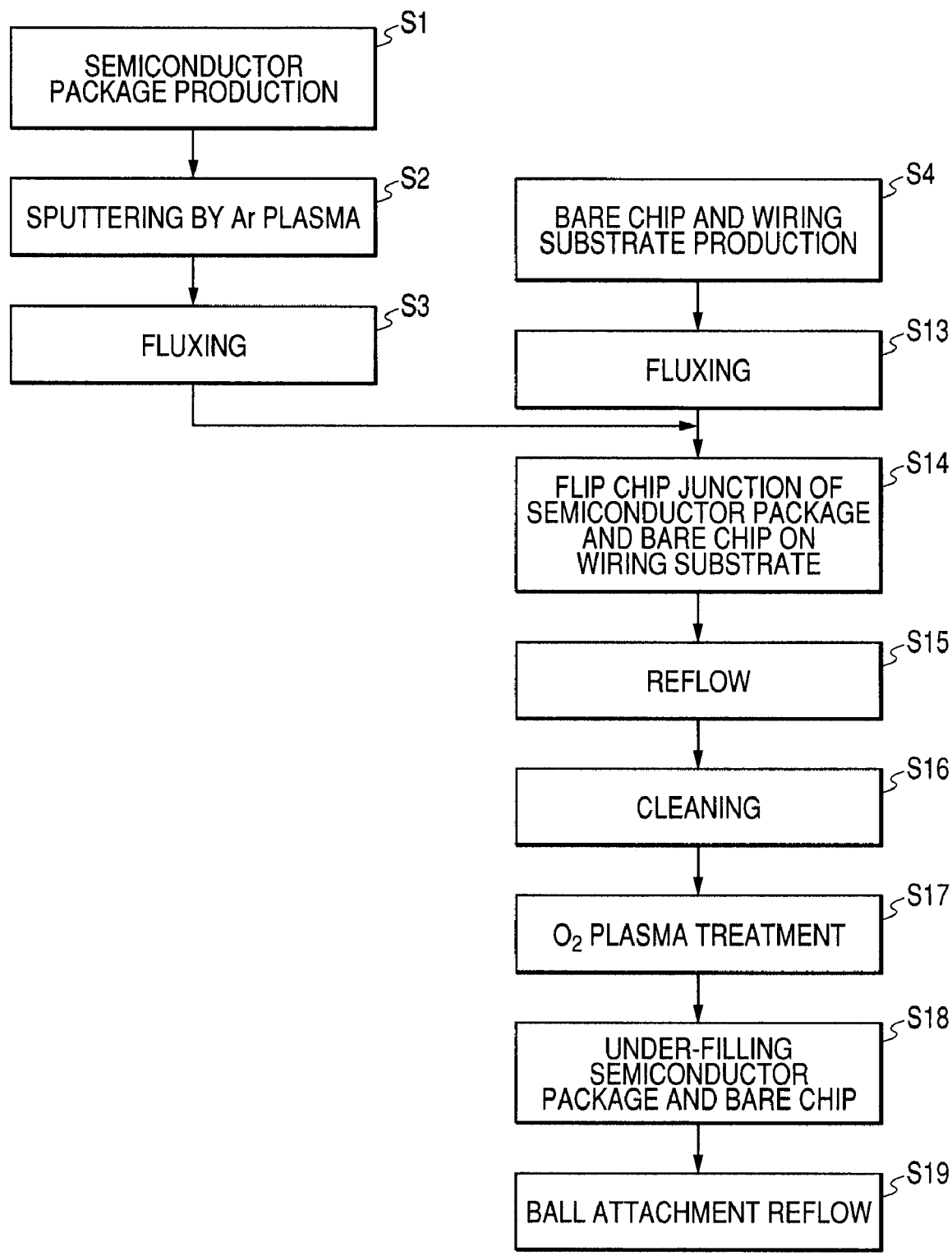
FIG. 17 is a flow chart which shows the manufacturing method of the semiconductor device concerning Embodiment 2 of the present invention.

Hereafter, the manufacturing method of the semiconductor device concerning Embodiment 2 of the present invention is explained referring to the flow chart of FIG. 17.

Figure 18:
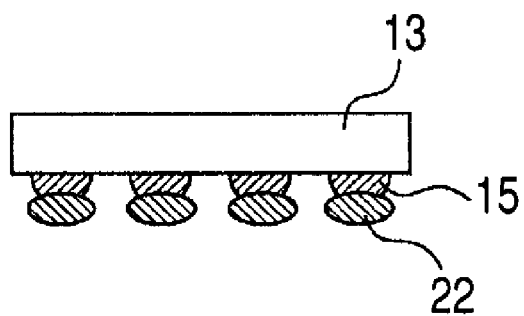
FIGS. 18 to 22 are side views showing the manufacturing process of the semiconductor device concerning Embodiment 2 of the present invention.

First, Steps S1-S4 are performed like Embodiment 1. Next, flux 22 is applied to the ball face of bare chip 13 as shown in FIG. 18 (Step S13).

Figure 19:
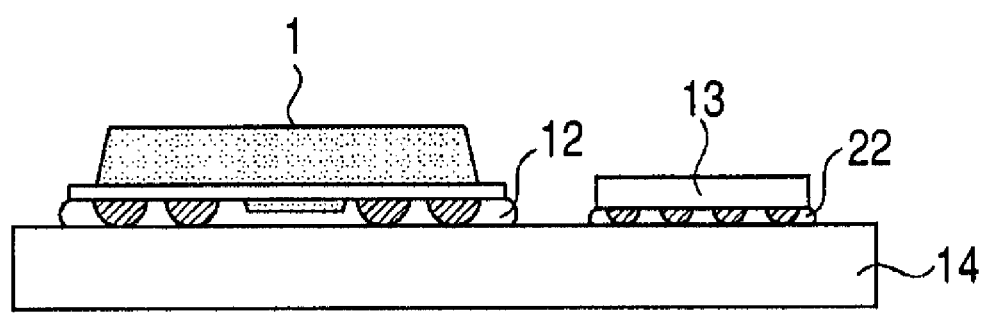
Figure 20:
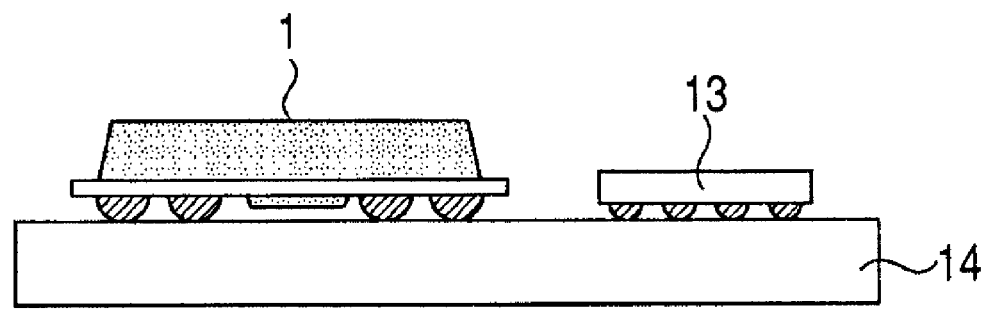

Next, as shown in FIG. 19, on wiring substrate 14, flux 12 and 22 is used and flip chip junction of semiconductor package 1 and the bare chip 13 is done (Step S14). And reflow is simultaneously performed about semiconductor package 1 and bare chip 13 (Step S15). Then, as shown in FIG. 20, washing is done and flux 12 and 22 is removed (Step S16).

Figure 21:
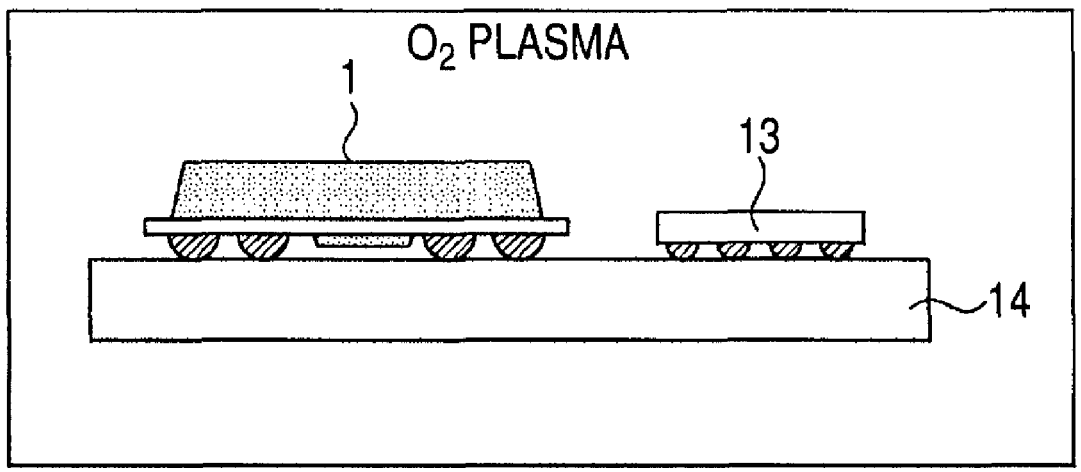
Figure 22:
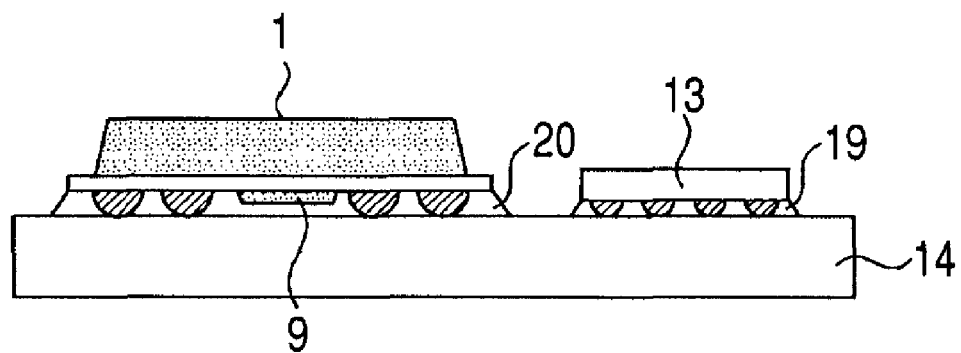

Next, as shown in FIG. 21, O2 plasma treatment is performed to semiconductor package 1 and bare chip 13 (Step S17). And as shown in FIG. 22, under-filling resin 20 is filled up between semiconductor package 1 and wiring substrate 14, and under-filling resin 19 is filled up between bare chip 13 and wiring substrate 14 (Step S18). Then, as shown in FIG. 16, solder ball 21 is attached to the under surface of wiring substrate 14 for external connection, and reflow is performed (Step S19).

By this embodiment, the same effect as Embodiment 1 is performed. Compared with joining applying supersonic vibration like Embodiment 1, joining time can be shortened by joining bare chip 13 using flux 22. Productivity improves by performing reflow simultaneously about semiconductor package 1 and bare chip 13.

What is claimed is:

1. A manufacturing method of a semiconductor device, comprising the steps of:
   forming a semiconductor package including a chip mounted on a substrate electrically connected with the chip and having electrodes;
   molding a mold resin having fillers and a mold release agent of at least one of a silicon oil, wax or fatty acid to seal the chip, wires and electrodes;
   forming solder balls at the electrodes along an under surface of the substrate to form a semiconductor package with a mold resin that has a ball face side;
   exposing the ball face side of the semiconductor package to sputtering by an Ar plasma to remove the release agent on the ball face side;
   applying a flux to the ball face side of the semiconductor package;
   attaching solder ball connections to an undersurface of a bare chip;
   providing a wiring substrate with a plurality of solder balls on which the semiconductor package and the bare chip are to be mounted;
   performing flip chip mounting of the semiconductor package and bare chip on the wiring substrate;
   performing reflow to attach the solder balls of the semiconductor package and bare chip to the wiring substrate, respectively; and
   under-filling the semiconductor package and the bare chip with respect to the wiring substrate.

2. A manufacturing method of a semiconductor device according to claim 1, further comprising performing $O_2$ plasma treatment after performing the flip chip mounting of the bare chip and the semiconductor package over the wiring substrate.

3. The manufacturing method of a semiconductor device according to claim 1, further comprising attaching to the under surface of the wiring substrate solder balls for external connection of the wiring substrate with the semiconductor package and bare chip.

4. The manufacturing method of a semiconductor device according to claim 1, wherein the forming of the mold resin step includes forming the mold resin with a metallic mold.

5. The manufacturing method of a semiconductor device according to claim 1, wherein in the sputtering step, an amount of the mold resin that is removed is equal to or less than an average diameter of the filler included in the mold resin.

* * * * *